(12) United States Patent
Cho et al.

(10) Patent No.: US 7,548,100 B2
(45) Date of Patent: Jun. 16, 2009

(54) DELAY LOCKED LOOP

(75) Inventors: Kwang Jun Cho, Seoul (KR); Kie Bong Ku, Cheongju-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 56 days.

(21) Appl. No.: 11/687,396

(22) Filed: Mar. 16, 2007

(65) Prior Publication Data
US 2007/0247203 A1   Oct. 25, 2007

(30) Foreign Application Priority Data
Apr. 24, 2006   (KR) .............. 10-2006-0036608

(51) Int. Cl.
*H03K 3/017* (2006.01)
(52) U.S. Cl. ...................................... 327/175
(58) Field of Classification Search ............... 327/172, 327/173, 174, 175, 176
See application file for complete search history.

(56) References Cited

U.S. PATENT DOCUMENTS

| 6,342,801 | B1 | 1/2002 | Shin |
| 6,566,925 | B2 * | 5/2003 | Ma ............... 327/175 |
| 6,831,493 | B2 * | 12/2004 | Ma ............... 327/175 |
| 6,859,081 | B2 | 2/2005 | Hong et al. |
| 6,934,215 | B2 | 8/2005 | Chung et al. |
| 6,963,235 | B2 | 11/2005 | Lee |
| 7,106,116 | B2 * | 9/2006 | Yamada ........... 327/175 |
| 7,116,143 | B2 | 10/2006 | Deivasigamani et al. |
| 7,215,168 | B2 * | 5/2007 | Takahashi et al. ..... 327/175 |
| 2006/0114041 | A1 | 6/2006 | Koo |
| 2006/0267649 | A1 | 11/2006 | Park et al. |

FOREIGN PATENT DOCUMENTS

| JP | 2004-129255 | 4/2004 |
| JP | 2006-060842 | 3/2006 |
| KR | 1020040021478 | 3/2004 |
| KR | 1020050040551 | 5/2005 |

OTHER PUBLICATIONS

Korean Notice of Allowance for 2006-36608.

* cited by examiner

*Primary Examiner*—Jeffrey S Zweizig
(74) *Attorney, Agent, or Firm*—Lowe Hauptman Ham & Berner, LLP

(57) ABSTRACT

The digital duty cycle correction circuit according to the present invention includes a first conversion circuit for buffering an internal clock output from a delay locked loop (DLL), converting the buffered internal clock into first and second clocks through first and second terminals, delaying the second clock according to voltage supplied to the second terminal through a capacitor, converting the delayed second clock into a first signal, and converting the first clock into a third clock, which rises at a falling edge of the first clock and falls at a rising edge of the first signal; and a second conversion circuit for converting the third clock into an output clock, which rises at a falling edge of the third clock and falls at a rising edge of the third clock.

9 Claims, 5 Drawing Sheets

DELAY LOCKED LOOP

CROSS-REFERENCES TO RELATED APPLICATIONS

The present application claims priority to Korean patent application number 10-2006-036608, filed on Apr. 24, 2006, which is incorporated by reference in its entirety.

BACKGROUND OF THE INVENTION

The present invention relates to a digital duty cycle correction circuit of a Delay Locked Loop (DLL).

In general, in DDR SDRAM, the input and output operations of data are performed at the rising and falling edges of a clock in synchronization with an external clock. The data output by the read operation must be identical to the timing of the rising and falling edges of an external clock. Therefore, it is required that a circuit within the DDR SDRAM receive the external clock and control the output of the data by generating an internal clock that is delayed for a given time. The circuit generating the internal clock includes a DLL or a Phase Locked Loop (PLL). Furthermore, although the ratio of a duty high pulse and a duty low pulse of an external input clock is distorted when the DLL or PLL is used, the signal retention ratio is satisfactory when the duty cycle of the output of the data is 0.5. Accordingly, circuits exceeding DDR2 necessarily require a Duty Cycle Corrector (DCC) circuit for sensing the duty of an external clock and making the duty cycle of a clock controlling the output of the data at the time of the output 0.5.

FIG. 1 is a schematic block diagram of a conventional DLL. The DLL 100 includes an input buffer 101, a global control unit 102, a first delay unit 110, a second delay unit 120, an ECDL controller 103, a mode generator 104, a delay control unit 105, a phase control unit 130, a DCC controller 106, a dummy output buffer 107 and an output buffer 108. The first delay unit 110 further includes a first phase detector 111, a first coarse delay unit 112, a first fine delay unit 113 and a first replica 114. The second delay unit 120 further includes a second phase detector 121, a second coarse delay unit 122, a second fine delay unit 123 and a second replica 124. The phase control unit 130 includes a first DCC phase mixer 131, a second DCC phase mixer 132 and a third phase detector 133.

The DCC are available in analog and in digital. The analog DCC circuit is high in accuracy, but is difficult to implement for high-speed operation, whereas the digital DCC circuit is easy to implement for high-speed operation, but occupies a large area and has high power consumption.

SUMMARY OF THE INVENTION

Accordingly, the present invention addresses the above problems, and discloses a duty correction circuit, in which it can correct the duty of an output pulse, minimize power consumption and area, and maintain an excellent performance even at a high-speed operation, by controlling delay within the circuit employing a difference in the voltage applied to a capacitor in the DLL.

A digital duty cycle correction (DCC) circuit according to an aspect of the present invention includes a first conversion circuit for buffering an internal clock output from a delay locked loop (DLL), converting the buffered internal clock into first and second clocks through first and second terminals, delaying the second clock according to voltage supplied to the second terminal through a capacitor, converting the delayed second clock into a first signal, and converting the first clock into a third clock, which rises at a falling edge of the first clock and falls at a rising edge of the first signal; and a second conversion circuit for converting the third clock into an output clock, which rises at a falling edge of the third clock and falls at a rising edge of the third clock.

A digital duty cycle correction (DCC) circuit according to an other aspect of the present invention includes a duty correction circuit for correcting a duty of a internal clock and outputting an output clock, a phase divider for generating a first clock having the same phase as that of the output clock and a second clock having an opposite phase to that of the first clock, in response to the output clock, a compare control unit for generating a pump reset signal and a compare control signal in response to the output clock, a DCC pump for pumping the first clock and the second clock and generating a first pumping clock and a second pumping clock, in response to a pump reset signal, a voltage comparator for sensing the compare control signal and voltage levels of the first pumping clock and the second pumping clock, and generating an increment/decrement signal, a counter for outputting a counter signal in response to the increment/decrement signal, and a voltage generator for generating a voltage in response to the counter signal.

DESCRIPTION OF SPECIFIC EMBODIMENTS

Now, specific embodiments according to the present patent will be described with reference to the accompanying drawings.

Figure 1:
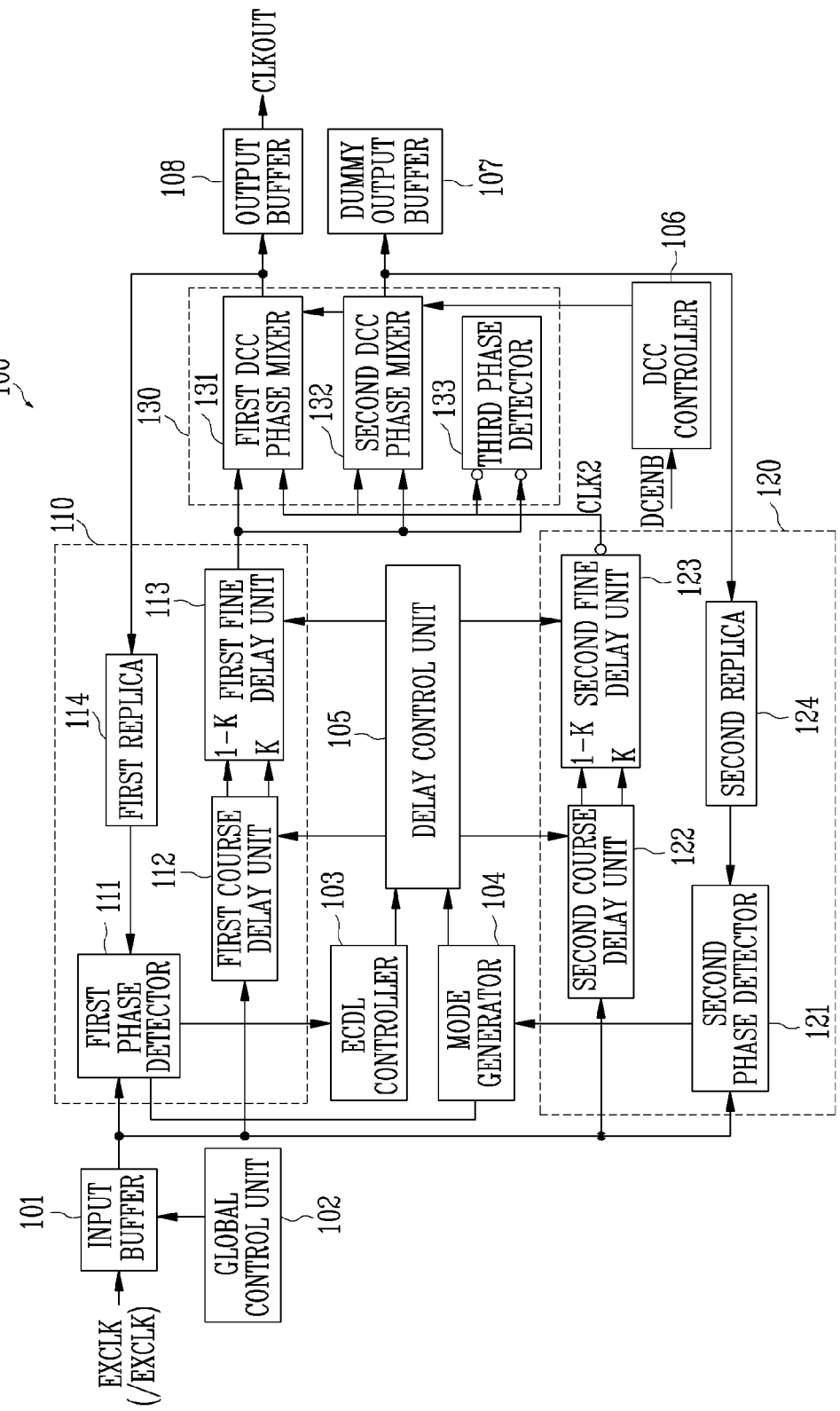
FIG. 1 is a schematic block diagram of a conventional DLL.
Figure 2:
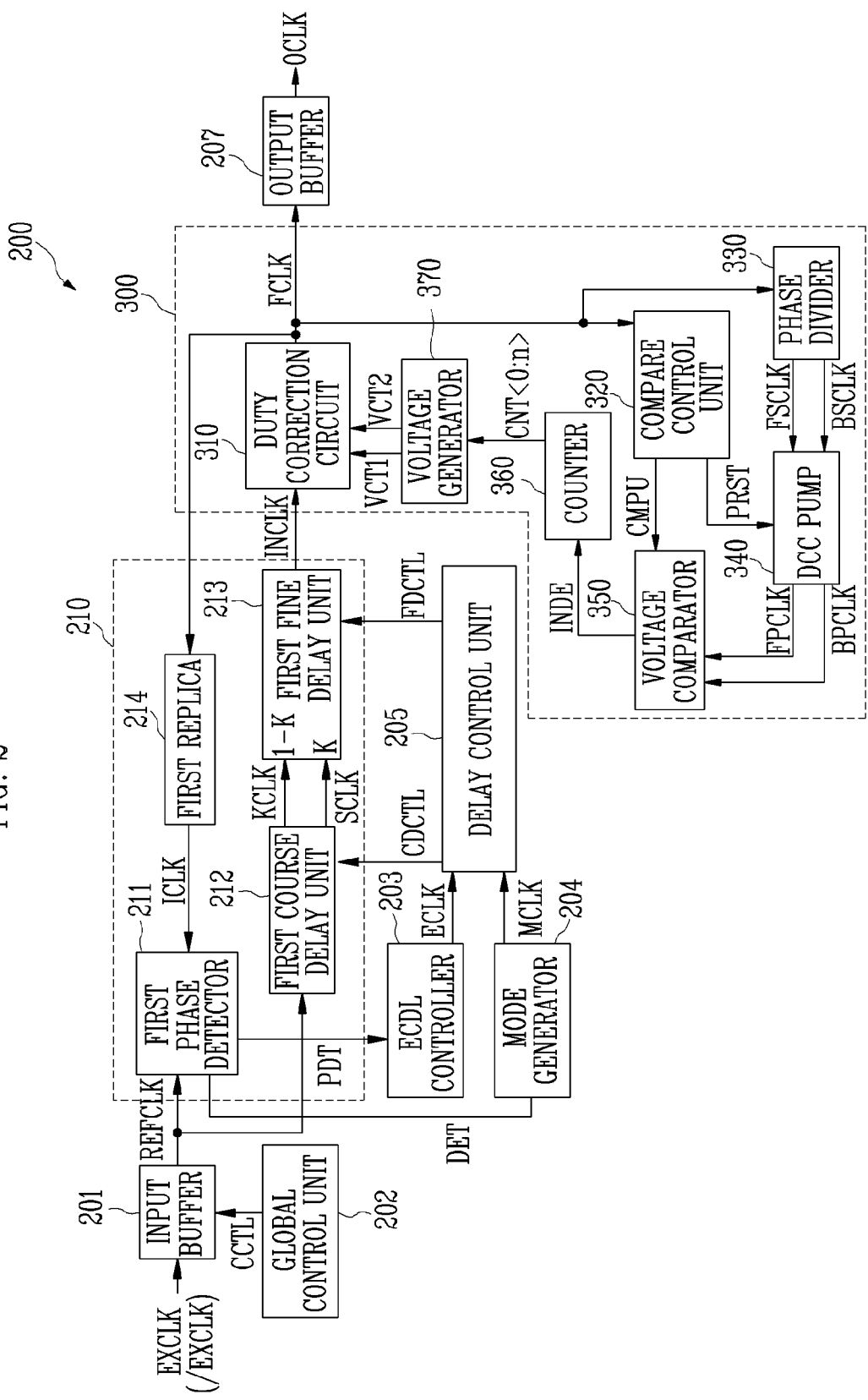
FIG. 2 is a schematic block diagram of a DLL according to the present invention.

FIG. 2 is a schematic block diagram of a DLL according to the present invention. The DLL 200 includes an input buffer 201, a global control unit 202, a delay unit 210, an ECDL controller 203, a mode generator 204, a delay control unit 205, a duty correction unit 300 and an output buffer 207. The delay unit 210 includes a first phase detector 211, a first coarse delay unit 212, a first fine delay unit 213 and a first replica 214. The duty correction unit 300 includes a duty correction circuit 310, a compare control unit 320, a phase divider 330, a DCC pump 340, a voltage comparator 350, a counter 360 and a voltage generator 370. The input buffer 201 receives an external clock EXCLK and outputs a reference clock REFCLK. The global control unit 202 generates a global clock signal CCTL that is periodically toggled. The first phase detector 211 compares the phases of the reference clock REFCLK and the reference clock ICLK and outputs a first detection signal PDT and a second detection signal DET according to the comparison result. The ECDL controller 203 and the mode generator 204 output a first control clock ECLK and a second control clock MCLK, respectively, in response to the first detection signal PDT and the second detection signal DET, respectively. The delay control unit 205 outputs a first delay control signal CDCTL and a second delay control signal FDCTL in response to the first control clock ECLK and the second control clock MCLK. The first coarse delay unit 212 controls a coarse delay time, delays the reference clock REFCLK during a controlled coarse delay time, and outputs coarse delay clock signals SCLK and SCLK in response to the first delay control signal CDCTL. The first replica 214 delays the output clock FCLK for a set time and outputs the reference clock ICLK. The duty correction circuit 310 controls a pulse width and outputs the output clock FCLK, in response to the internal clock INCLK. The compare control unit 320 outputs a compare control signal CMPU and a pump reset signal PRST in response to the output clock FCLK. The phase divider 330 generates a first clock FSCLK and a second clock BSCLK in response to the output clock FCLK. Preferably, the first clock FSCLK is output as a signal having the same phase as that of the applied output clock FCLK, and the second clock BSCLK is output as a signal having an opposite phase to that of the first clock FCLK. The DCC pump 340 receives the first clock FSCLK and the second clock BSCLK, determines duty mismatch, pumps the first clock FSCLK and the second clock BSCLK to a specific level or higher or lower, and outputs a first pumping clock FPCLK and a second pumping clock BPCLK. The voltage comparator 350 compares voltage levels of the first pumping clock FPCLK and the second pumping clock BPCLK, determines whether a high pulse width has been increased or decreased, and outputs an increment/decrement signal INDE, in response to a compare control signal CMPU. Preferably, the voltage comparator 350 senses the first pumping clock FPCLK applied thereto, outputs the increment/decrement signal INDE of a logic high when the first pumping clock FPCLK is higher than a specific level, and outputs the increment/decrement signal INDE of a logic low when the first pumping clock FPCLK is lower than a specific level. The counter 360 converts the increment/decrement signal INDE into a binary number in response to the increment/decrement signal INDE, and outputs a counter signal CNT<0:n>. The voltage generator 370 outputs a first control signal VCT1 and a second control signal VCT2 in response to the counter signal CNT<0:n>.

Figure 3:
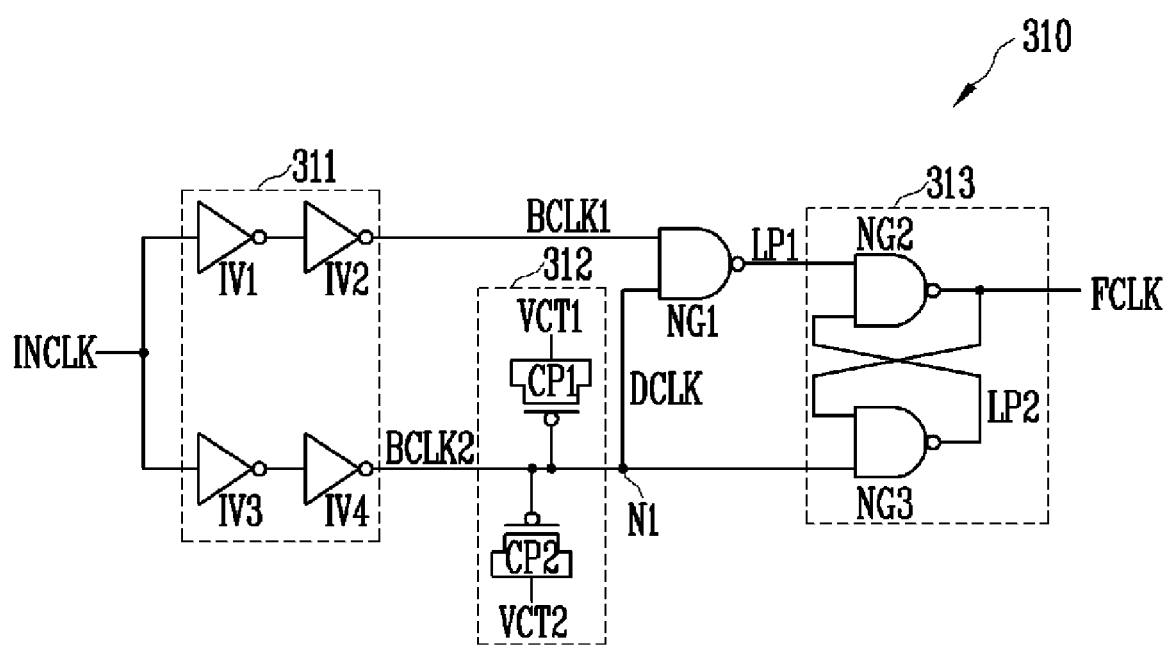
FIG. 3 is a detailed circuit diagram of a duty correction circuit shown in FIG. 2.

FIG. 3 is a detailed circuit diagram of the duty correction circuit 310 shown in FIG. 2. The duty correction circuit 310 includes a buffer unit 311, a delay control unit 312, a NAND gate NG1 and a flip-flop unit 313. The buffer unit 311 includes a plurality of inverters IV1 to IV4. The plurality of inverters IV1 and IV2 buffer the internal clock INCLK and output a first input clock BCLK1. The remaining inverters IV3 and IV4 buffer the internal clock INCLK and output a second input clock BCLK2. The delay control unit 312 may include a plurality of capacitors CP1 and CP2. The first capacitor CP1 may be implemented using a PMOS type transistor and the second capacitor CP2 may be implemented using a NMOS type transistor. The first capacitor CP1 and the second capacitor CP2 delay the second input clock BCLK2 according to the first control signal VCT1 and the second control signal VCT2, respectively. Therefore, the node N1 is applied with the delay signal DCLK, which has the same phase as or is delayed from that of the second input clock BCLK2. The NAND gate NG1 outputs a first logic signal LP1 in response to the first input clock BCLK1 and the delay signal DCLK. More particularly, if the first input clock BCLK1 becomes logic high, the delay signal DCLK becomes logic high after a delay time. The first logic signal LP1 is switched from a high state to a low state after the delay time. The flip-flop unit 103 includes NAND gates NG2 and NG3. The second NAND gate NG3 outputs a second logic signal LP2 in response to the delay signal DCLK and the output clock FCLK. The first NAND gate NG2 generates the output clock FCLK in response to the first logic signal LP1 and the second logic signal LP2. As another embodiment of the present invention, the capacitors CP1 and CP2 may be replaced with a resistor (not shown).

Figure 4:
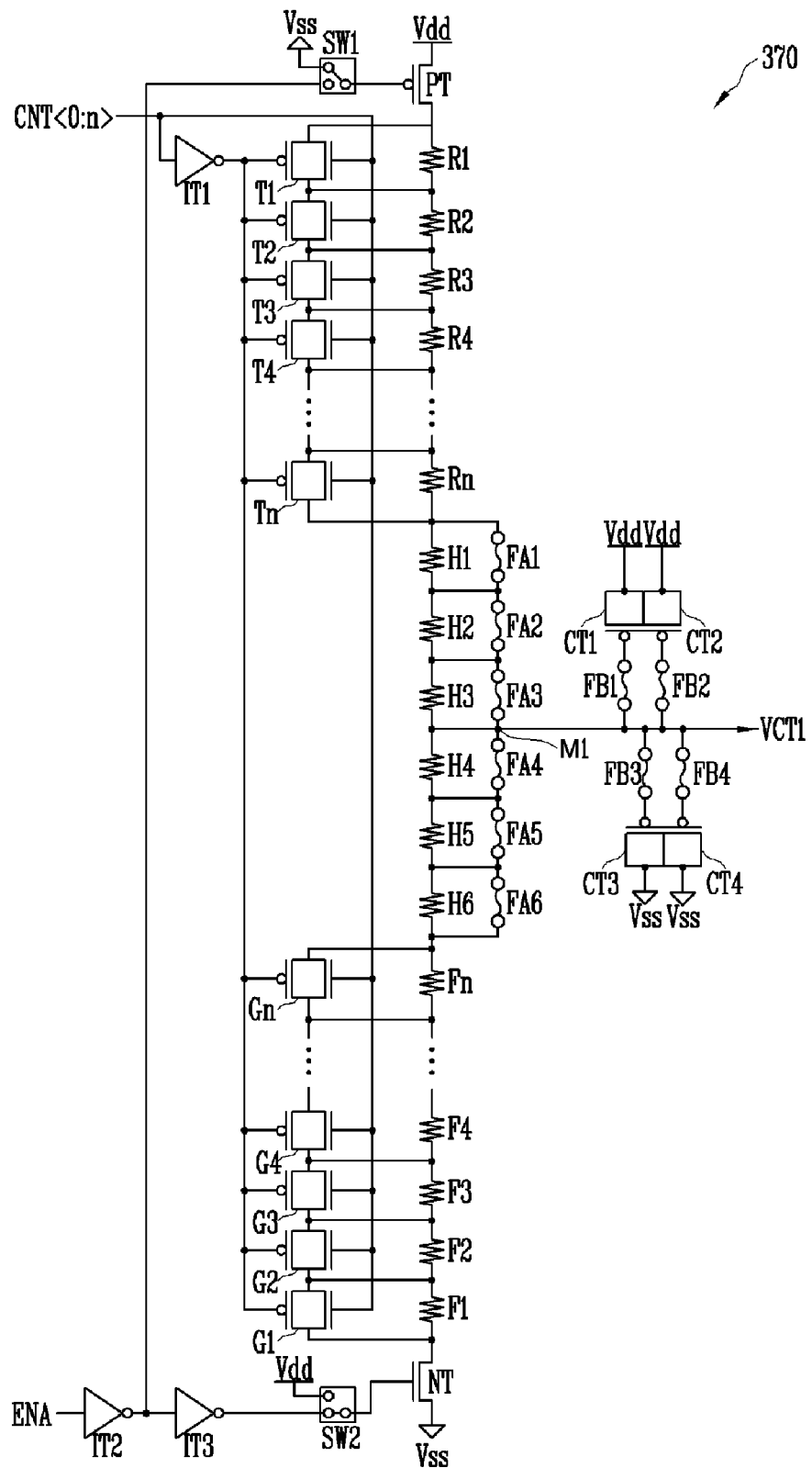
FIG. 4 is a detailed circuit diagram of a voltage generator shown in FIG. 2.

FIG. 4 is a detailed circuit diagram of the voltage generator shown in FIG. 2. The voltage generator 370 includes a plurality of inverters IT1 to IT3, switching elements SW1 and SW2, a PMOS transistor PT, a NMOS transistor NT, a plurality of transfer gates T1 to Tn and G1 to Gn, resistors R1 to Rn, H1 to H6 and F1 to Fn, fuses FA1 to FA6 and FB1 to FB4, and capacitors CT1 to CT4. If an enable signal ENA is enabled, the first switching element SW1 transfers a ground voltage Vss to the PMOS transistor PT, and the second switching elements SW2 transfers a power supply voltage Vdd to the NMOS transistor NT. A voltage is applied to the node M1 through the plurality of transfer gates T1 to Tn and G1 to Gn, which are connected in series, the resistors R1 to Rn, H1 to H6, and F1 to Fn, and the fuses FA1 to FA6. The voltage applied to the node M1 is changed to the first control signal VCT1 whose voltage level has been controlled according to the connection state of the plurality of capacitors CT1 to CT4 and the plurality of fuses FB1 to FB4, and is then applied to the duty correction circuit 310. In the present embodiment, it has been described that two voltage generators 370 are used in FIG. 2 in order to output the first control signal VCT1 and the second control signal VCT2. However the number of the voltage generators 370 may be changed, if needed.

Figure 5:
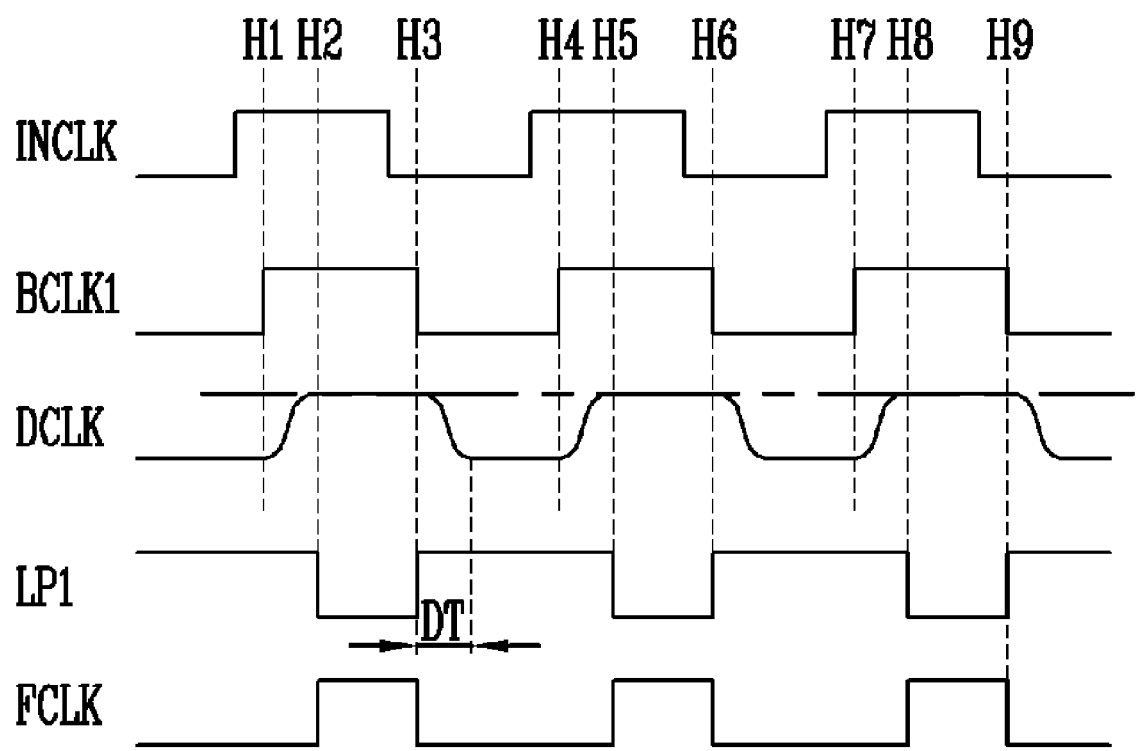
FIG. 5 is a timing diagram of the duty correction circuit shown in FIG. 3.

FIG. 5 is a timing diagram of the duty correction circuit 310 shown in FIG. 3. At H1, the internal clock INCLK is delayed by the plurality of inverters IV1 and IV2 and is thus output as the first input clock BCLK1. The second input clock BCLK2 is also generated in synchronization with the first input clock BCLK1. At this time, the charging times of the capacitors CP1 and CP2 are changed depending on the levels of the first control signal VCT1 and the second control signal VCT2. Accordingly, the second input clock BCLK2 is delayed and a delayed delay signal DCLK is input to the node N1. The delay signal DCLK represents an analog waveform by means of the capacitance of capacitors CP1 and CP2. At H2, the delay signal DCLK becomes fully logic high and the NAND gate NG1 outputs the first logic signal LP1 of logic low. At H3, the first logic signal LP1 is changed to logic high simultaneously when the second input clock BCLK2 shifts to logic low and the delay signal DCLK shifts to logic low. Accordingly, the output clock FCLK having a duty corrected by the delay is generated. If voltages applied to the capacitors CP1 and CP2 are controlled, the capacitances of the capacitors CP1 and CP2 can be controlled. Accordingly, fine-tuning is possible since the delay of the delay clock signal DCLK can be controlled.

As described above, according to the digital duty cycle correction circuit of the semiconductor memory device in accordance with the present invention, delay within a circuit can be controlled by employing a difference in voltages applied to capacitors in a DLL. Accordingly, a duty cycle can be corrected by controlling delay of an output clock. It is therefore possible to minimize current consumption and area and to construct a duty correction circuit having an excellent performance even at a high-speed operation.

Although the foregoing description has been made with reference to the various embodiments, it is to be understood that changes and modifications of the present patent may be made by those having ordinary skill in the art without departing from the spirit and scope of the present patent and appended claims.

What is claimed is:

1. A digital duty cycle correction (DCC) circuit, comprising:
a first conversion circuit for buffering an internal clock output from a delay locked loop (DLL), converting the buffered internal clock into first and second clocks through first and second terminals, delaying the second clock according to voltage supplied to the second terminal through a first capacitor, and converting the first clock into a third clock, which rises at a falling edge of the first clock and falls at a rising edge of a delayed second clock ; and
a second conversion circuit for convening the third clock into an output clock, which rises at a falling edge of the third clock and falls at a rising edge of the third clock.

2. The duty cycle correction circuit of claim 1, wherein the first conversion circuit comprises:
a first inverter for converting the internal clock into the first clock;
a second inverter for converting the internal clock into the second clock;
the first capacitor for supplying the voltage to the second terminal, that is, an output of the second inverter; and
a logic element for combining the first clock and an output of the second inverter and outputting the third clock.

3. The duty cycle correction circuit of claim 1, wherein the second conversion circuit comprises a flip-flop for generating the output clock by using the third clock and the delayed second clock as inputs.

4. The duty cycle correction circuit of claim 2, wherein the first conversion circuit further comprises a second capacitor for supplying a second voltage different from the voltage to the second terminal, that is, an output of the second inverter.

5. The duty cycle correction circuit of claim 1, wherein the voltage supplied to the second terminal through the first capacitor is generated by:
a phase divider for generating second and third signals having opposite phases in response to the output clock from the second conversion circuit;
a compare control unit for generating a pump reset signal and a compare control signal in response to the output clock;
a duty cycle correction pump for pumping the second and third signals and generating a first pumping clock and a second pumping clock, in response to the pump reset signal;
a voltage comparator for sensing the compare control signal and voltage levels of the first and second pumping clocks, and generating an increment/decrement signal;
a counter for outputting a counter signal in response to the increment/decrement signal; and
a voltage generator operating in response to the counter signal.

6. The duty cycle correction circuit of claim 5, wherein the duty cycle correction pump determines duty mismatch by comparing the first clock and the second clock, pumps the first clock and the second clock to a specific level or more or less, and outputs the first pumping clock and the second pumping clock.

7. The duty cycle correction circuit of claim 5, wherein the voltage comparator determines a level of an increase or decrease of a high pulse width by comparing levels of the first pumping clock and the second pumping clock in response to the compare control signal, and outputs a signal that increases or decreases to the counter.

8. The duty cycle correction circuit of claim 7, wherein the voltage comparator outputs the increment signal when the level of the first pumping clock is higher than a specific level, and outputs the decrement signal when the level of the first pumping clock is lower than a specific level.

9. The duty cycle correction circuit of claim 5, wherein the counter converts bits of the increment and decrement signals into a binary number, and outputs a converted binary number as the counter signal.

* * * * *